United States Patent
Jin et al.

(10) Patent No.: US 9,159,862 B2
(45) Date of Patent: Oct. 13, 2015

(54) SOLAR CELL AND MANUFACTURING METHOD THEREOF

(75) Inventors: Yoonsil Jin, Changwon-si (KR);
Hyunjung Park, Changwon-si (KR);
Youngho Choe, Changwon-si (KR);
Changseo Park, Changwon-si (KR)

(73) Assignee: LG ELECTRONICS INC., Seoul (KR)

(*) Notice: Subject to any disclaimer, the term of this patent is extended or adjusted under 35 U.S.C. 154(b) by 385 days.

(21) Appl. No.: 13/469,738

(22) Filed: May 11, 2012

(65) Prior Publication Data

US 2013/0056051 A1 Mar. 7, 2013

(30) Foreign Application Priority Data

Sep. 7, 2011 (KR) .................... 10-2011-0090802

(51) Int. Cl.
*H01L 31/0352* (2006.01)
*H01L 31/18* (2006.01)
*H01L 31/068* (2012.01)

(52) U.S. Cl.
CPC .............. *H01L 31/18* (2013.01); *H01L 31/068* (2013.01); *Y02E 10/547* (2013.01)

(58) Field of Classification Search
CPC ..................... H01L 31/0248; H01L 31/0352
USPC ................... 136/244, 252, 256, 261
See application file for complete search history.

(56) References Cited

U.S. PATENT DOCUMENTS

| | | | |
|---|---|---|---|
| 2004/0112426 A1* | 6/2004 | Hagino | 136/261 |
| 2009/0020158 A1* | 1/2009 | Ohtsuka et al. | 136/261 |
| 2009/0227094 A1 | 9/2009 | Bateman et al. | |
| 2010/0229925 A1* | 9/2010 | Kim et al. | 136/252 |
| 2010/0323508 A1 | 12/2010 | Adibi et al. | |
| 2010/0326504 A1* | 12/2010 | Park et al. | 136/255 |
| 2011/0139226 A1* | 6/2011 | Ha et al. | 136/252 |
| 2011/0177652 A1 | 7/2011 | Gupta et al. | |

FOREIGN PATENT DOCUMENTS

KR 10-2011-0027388 A 3/2011

OTHER PUBLICATIONS

KR 10-2011-0027388 Mar. 16, 2011, machine translation.*
Gupta et al., "High Efficiency Selective Emitter Cells Using In-Situ Patterned Ion Implantation," 25th European Photovoltaic Solar Energy Conference and Exhibition, 5th World Conference on Photovoltaic Energy Conversion, Sep. 6-10, 2010, pp. 1158-1162, XP40530955.

* cited by examiner

*Primary Examiner* — Susan D Leong
(74) *Attorney, Agent, or Firm* — Birch, Stewart, Kolasch & Birch, LLP

(57) ABSTRACT

A solar cell is formed to have a silicon semiconductor substrate of a first conductive type; an emitter layer having a second conductive type opposite the first conductive type and formed on a first surface of the silicon semiconductor substrate; a back surface field layer having the first conductive type and formed on a second surface of the silicon semiconductor substrate opposite to the first surface; and wherein the emitter layer includes at least a first shallow doping area and the back surface field layer includes at least a second shallow doping area, and wherein a thickness of the first shallow doping area of the emitter layer is different from a thickness of the second shallow doping area of the back surface field layer.

7 Claims, 12 Drawing Sheets

(a)

(b)

(a)

(b)

SOLAR CELL AND MANUFACTURING METHOD THEREOF

CROSS-REFERENCE TO RELATED APPLICATION

This application claims priority to and the benefit of Korean Patent Application No. 10-2011-0090802, filed on Sep. 7, 2011 in the Korean Intellectual Property Office, the disclosure of which is incorporated herein by reference.

BACKGROUND OF THE INVENTION

1. Field of the Invention

Embodiments of the invention relate to a solar cell and a manufacturing method for the solar cell. More specifically, the embodiments of the invention relate to a solar cell, where a thickness of an emitter layer and a thickness of a back surface field layer are different from each other, and a manufacturing method for the solar cell.

2. Description of the Related Art

As depletion of conventional energy resources such as oil or coal is anticipated, an interest for alternative energy resources is increasing in the hopes of substituting them for the conventional energy resources. Among others, solar cells are receiving particular attention from the public as a next generation device capable of converting solar energy directly into electric energy by use of semiconductors.

In other words, a solar cell is a device converting solar energy into electric energy by using a photovoltaic effect. Depending on the material employed, solar cells may be classified into a silicon solar cell, a thin-film type solar cell, a dye-sensitized solar cell, and an organic polymer-type solar cell, where silicon solar cells are most prevalent over the other types of solar cells. For the solar cells discussed above, it is very important to improve the efficiency thereof, which is related to a ratio of converting incident light rays into electric energy.

SUMMARY OF THE INVENTION

The embodiments of the invention are directed to providing a solar cell with excellent photovoltaic conversion efficiency and a manufacturing method for the solar cell.

To achieve this and other objectives, a solar cell according to one embodiment of the invention includes a silicon semiconductor substrate of a first conductive type; an emitter layer having a second conductive type opposite the first conductive type and formed on a first surface of the silicon semiconductor substrate; a back surface field layer having the first conductive type and formed on a second surface of the silicon semiconductor substrate opposite to the first surface; and wherein the emitter layer includes at least a first shallow doping area and the back surface field layer includes at least a second shallow doping area, and wherein a thickness of the first shallow doping area of the emitter layer is different from a thickness of the second shallow doping area of the back surface field layer.

Also, to achieve the objective, a manufacturing method for a solar cell according to one embodiment of the invention includes preparing a silicon semiconductor substrate of a first conductive type; forming a first impurity doped region by a first ion implantation of a first impurity having a second conductive type opposite the first conductive type on a first surface of the silicon semiconductor substrate; forming a second impurity doped region by performing a second ion implantation of a second impurity having the first conductive type on a second surface of the silicon semiconductor substrate opposite to the first surface; and performing a heat treatment to both of the first impurity doped region and the second impurity doped region to form an emitter layer and a back surface field layer, respectively, wherein the emitter layer includes at least a first shallow doping area and the back surface field layer includes at least a second shallow doping area, and wherein a thickness of the first shallow doping area of the emitter layer is different from a thickness of the second shallow doping area of the back surface field layer.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention.

DETAILED DESCRIPTION OF THE EMBODIMENTS

Embodiments of the invention will be described in more detail with reference to appended drawings.

Hereinafter, the drawings include reference to elements being all formed, installed, constructed "directly" or "indirectly", "on" or "under" of respective elements, and references for to elements being "on" and "under" of the respective other elements will be described based on the drawings. The respective elements are may be exaggerated, omitted, or schematically illustrated for the illustrative convenience.

Figure 1:
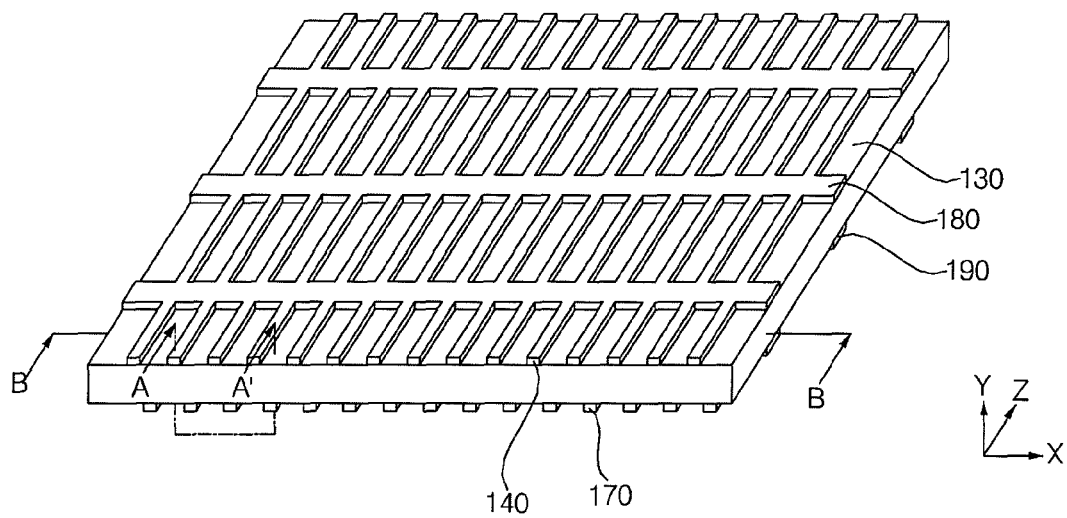
FIG. 1 is a perspective view of a solar cell according to one embodiment of the invention.
Figure 2:
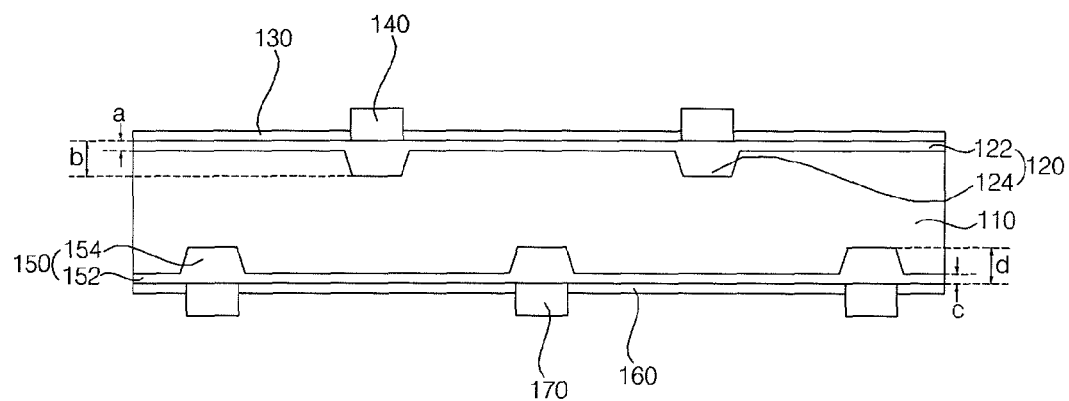
FIG. 2 is a cross-sectional view of the solar cell of FIG. 1 along line A-A'.
Figure 3:
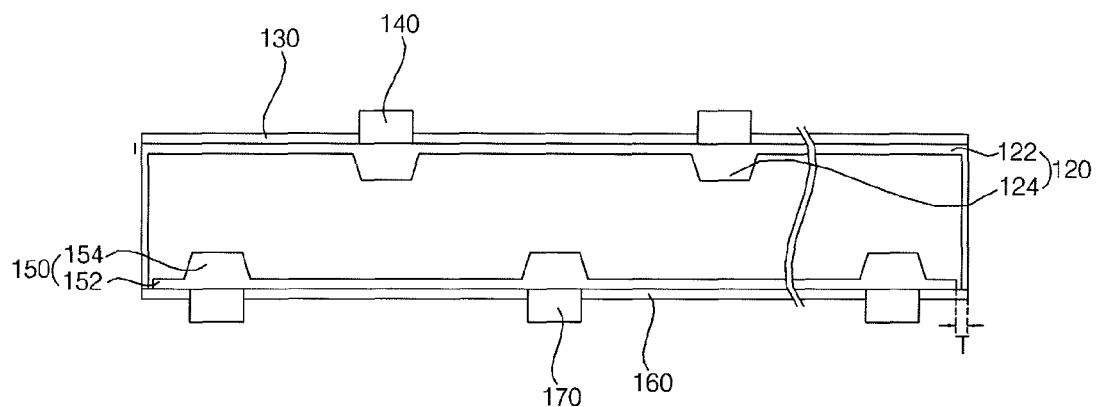
FIG. 3 is a cross-sectional view of the solar cell of FIG. 1 along line B-B'.

FIG. 1 is a perspective view of a solar cell according to one embodiment of the invention; FIG. 2 is a cross-sectional view of the solar cell of FIG. 1 along line A-A'; FIG. 3 is a cross-sectional view of the solar cell of FIG. 1 along line B-B'. In this Instance, FIGS. 2 and 3 correspond to cross-sectional views as the solar cell of FIG. 1 is cut parallel to the X-Y plane and observed along the Z axis.

With reference to the figures, a solar cell 100 according to one embodiment of the invention includes a silicon semiconductor substrate 110 of a first conductive type; an emitter layer 120 disposed on one surface of the substrate 110; a plurality of front finger lines (or front finger electrodes) 140 connected to the emitter layer 120; a back surface field layer 150 on the other surface of the substrate 110; and a plurality of rear finger lines (or rear finger electrodes) 170 connected to the back surface field layer 150. Also, the solar cell 100 may include a first anti-reflection film 130 on the emitter layer 120 and a second anti-reflection film 160 on the back surface field layer 150.

The substrate 110 may be made from silicon and may be formed of a first conductive type and be doped with a P or an N-type impurity. For example, silicon may be doped with an impurity of a group 3 element such as B, Ga, and In, and be implemented as a P-type, while the silicon may be doped with an impurity of group 5 element such as P, As, and Sb, and be implemented as an N-type.

The surface of the substrate 110 may have a convex-concave structure. The convex-concave structure denotes a convex-concave pattern on the surface of the substrate 110, which is formed from texturing. If texturing is applied to the substrate 110, as described later, the emitter layer 120, the first anti-reflection layer 130, the back surface field layer 150, and the second anti-reflection layer 160 may also be formed according to the pattern of the convex-concave structure. Therefore, a reflection rate of light rays incident on the solar cell 100 is decreased and the amount of light captured is increased, whereby optical loss of the solar cell 100 is decreased.

The emitter layer 120 is formed as the substrate 110 is doped with a first impurity of a second conductive type opposite to that of the substrate 110. For example, if the substrate 110 is a P-type, the emitter layer 120 is doped with an N-type impurity, while if the substrate 110 is an N-type, the emitter layer 120 is doped with a P-type impurity. As described above, if the substrate 110 and the emitter layer 120 are doped with opposite types of impurities to each other, a P-N junction is formed in a surface between the substrate 110 and the emitter layer 120.

On the other hand, the emitter layer 120 may comprise a first area 124 adjoining the plurality of front finger lines 140 and a second area 122 disposed between the plurality of front finger lines 140, namely, respective areas that are between a plurality of first areas 124.

In general, the more impurities the emitter layer 120 contains, the more recombination electron-hole pairs are generated from contribution of the photovoltaic effect. Therefore, for the second area 122 where photons are converted to electron-hole pairs, it is advantageous to have a relatively low impurity density; and for the first area 124 where separated electrons or holes move toward the front finger lines 140, it is more desirable to have a relatively high impurity density to reduce contact resistance.

Therefore, to reduce surface resistance against the front finger lines 140 and prevent or reduce degradation of efficiency of a solar cell 100 due to surface recombination, the solar cell 100 according to the invention may be formed such that the first area 124 adjoining the front finger lines 140 has a relatively high doping density than that of the second area 122. Accordingly, the surface resistance of the first area 124 of the emitter layer 120 is made to be smaller than that of the second area 122. Also, the doping thickness b of the first area 124 may be made larger than the doping thickness a of the second area 122.

The first area 124 of the emitter layer 120 may have a doping density ranging from 1E19 to 1E21 and a doping depth (or a thickness) of 0.5 µm to 2 µm, while the second area 122 may have a doping density ranging from 5E18 to 1E20 and a doping depth (or a thickness) of 0.3 µm to 1 µm.

In this instance, the surface resistance of the first area 124 of the emitter layer 120 may be set to range from 30 to 70Ω/□, for instance 40 to 60Ω/□ while the surface resistance of the second area 122 from 70 to 150Ω/□ for instance from 90 to 120 Ω/□.

The first anti-reflection film 130 reduces reflection rate of solar rays incident on the front surface of the substrate 110. Accordingly, the amount of solar energy reaching the P-N junction is increased, thereby increasing short circuit current Isc of the solar cell 100. The first anti-reflection film 130 may have a single film structure comprising a single film selected from a group consisting of silicon nitride, silicon oxide, silicon oxy-nitride, intrinsic amorphous silicon, $MgF_2$, ZnS, $TiO_2$ and $CeO_2$; or a multi-layer film structure comprising a combination of two or more of such films or materials. Other materials may be used. If the substrate 110 is a P-type, the first anti-reflection film 130 may perform a function of a passivation layer.

The first anti-reflection film 130 has a refractive index ranging from 1.8 to 2.5 and thickness of 60 to 100 µm. In particular, if the refractive index of the first anti-reflection film 130 is smaller than 1.8, the anti-reflection effect is not substantial. On the contrary, if the refractive index is larger than 2.5, among incident light rays, those wavelengths that contribute to current conversion are optically absorbed into the first anti-reflection film 130, reducing the photovoltaic conversion efficiency of the solar cell 100.

Meanwhile, if the substrate 110 is an N-type, a passivation layer may be further included between the emitter layer 120 and the first anti-reflection film 130. The passivation layer may be formed from SiOx, AlxOy, and so on. Accordingly, a combined structure of passivation layer/first anti-reflection film 130 such as $SiO_2/SiN_x$, $Al_2O_3$/SiNx and so on, is possible but such is not limited to the above.

A multiple number of front finger lines 140 are formed and collect electrons or holes generated due to the photovoltaic effect. Also, the plurality of front finger lines 140 may adjoin front surface bus electrode 180 intersecting the front finger lines 140. The front surface bus electrode 180 may provide currents generated from the solar cell 100 to the outside, by connection to a ribbon.

In the case when the emitter layer 120 is a P-type, for ohmic contact with the emitter layer 120, the front finger lines 140 may be formed in such a way that paste comprising AgAl, glass frit, and so on is screen printed on the area for the front finger lines 140 by using a mask with openings, and then heat treatment is applied for the paste. On the other hand, if the emitter layer 120 is an N-type, paste including Ag, glass frit, and so on is screen printed and then heat treatment is applied to the paste, forming the front finger lines 140.

Also, the front finger lines 140 may be formed by removing portions of the first anti-reflection film 130 by using laser ablation, depositing a seed layer based on Ni at the removed portions, and then depositing a metal layer by using coating or sputtering. The front finger lines 140 formed as described above may have a structure of Ni/Cu/Sn, Ni/Ag, or Ni/Cu/Ag but are not limited to the above. Additionally, the front finger lines 140 above may be formed to have a width of 10 µm or more and a height of 60 to 80 µm, but are not limited to the above.

The back surface field layer 150 is a high density doping area, capable of preventing or reducing recombination of separated electron-hole pairs, reducing leakage currents, and making excellent ohmic contact with the rear finger lines 170. The back surface field layer 150 may be formed using a second impurity of the first conductive type which is the same type as the substrate 110.

Also, the back surface field layer 150 may have the same structure as the aforementioned emitter layer 120. In other words, the back surface field layer 150 may include a third area 154 adjoining the plurality of front finger lines 170 and a fourth area 152 that are between areas among the plurality of rear finger lines 170, namely, the respective areas that are between a plurality of third areas 154. The doping density of impurities in the third area 154 may be larger than that of the fourth area 152. Therefore, a solar cell 100 according to one embodiment of the invention may be a bifacial solar cell, the structure of which has a selective emitter layer 120, and at the same time, a selective back surface field layer 150.

Meanwhile, since the doping density of the third area 154 of the back surface field layer 150 is larger than that of the fourth area 152, contact resistance between the third area 154 and the rear finger lines 170 is reduced, and since the fourth area 152 is formed throughout the rear surface of the substrate 110, recombination of electrons and holes may be effectively prevented or reduced. Therefore, since loss due to recombination of electrons and holes is reduced and at the same time, transfer of electrons and holes generated by the photovoltaic effect to the rear finger lines 170 is further expedited, photovoltaic conversion efficiency of the solar cell 100 may be greatly improved.

The third area 154 of the back surface field layer 150 may have a doping density ranging from 1E19 to 1E21 and a doping depth of 0.5 μm to 2 μm, while the fourth area 152 may have a doping density ranging from 5E18 to 1E20 and a doping depth of 0.3 μm to 1 μm.

In this instance, the surface resistance of the third area 154 of the back surface field layer 150 may be set to range from 20 to 70Ω/□, for instance 40 to 60Ω/□ while the surface resistance of the fourth area 152 from 60 to 150Ω/□, for instance from 90 to 120Ω/□. Thickness of the third area 154 may be larger than that of the fourth area 152.

Meanwhile, according to embodiments of the invention, thickness of the back surface field layer 150 may be formed differently from that of the emitter layer 120.

First, if the substrate 110 is of an N-conductive type, for example, the back surface field layer 150 may be doped with an N-type impurity (e.g., P), while the emitter layer 120 with a P-type impurity (e.g., B). In this instance, thickness of the back surface field layer 150 may be larger than that of the emitter layer 120. To be more specific, a doping thickness d of the third area 154 of the back surface field layer 150 is deeper (or greater) than the doping thickness b of the first area 124 of the emitter layer 120; and doping thickness c of the fourth area 152 of the back surface field layer 150 may be formed more deeply than the doping thickness a of the second area 122 of the emitter layer 120. Also, a width of the third area 154 of the back surface field layer 150 may be formed to be larger (or greater) than a width of the first area 124 of the emitter layer 120.

As described above, if thicknesses of the back surface field layer 150 are formed to be larger than thicknesses of corresponding portions of the emitter layer 120, the entire series resistance of the solar cell 100 is reduced and thus, fill factor (FF) of the solar cell 100 is increased.

On the other hand, as a different example, if the substrate 110 is of a P-conductive type, the back surface field layer 150 may be doped with a P-type impurity (e.g., B), while the emitter layer 120 is doped with an N-type impurity (e.g., P). In this instance, a thickness of the emitter layer 120 may be larger than that of the back surface field layer 150. In this instance, a density of surface impurities of the emitter layer 120 may be reduced and a deep junction is formed easily. Therefore, an open voltage Voc of the solar cell 100 may be increased. To be more specific, the doping thickness d of the third area 154 of the back surface field layer 150 is smaller than doping thickness b of the first area 124 of the emitter layer 120, and the doping thickness d of the fourth area 152 of the back surface field layer 150 may be formed smaller than the doping thickness a of the second area 122 of the emitter layer 120. Also, the width of the third area 154 of the back surface field layer 150 may be formed to be smaller than the width of the first area 124 of the emitter layer 120.

Meanwhile, a second anti-reflection film 160 is disposed on the back surface field layer 150. The second anti-reflection film 160 may be similar to the first anti-reflection film 130 described above. In other words, the second anti-reflection film 160 has a single film structure comprising a single film selected from a group consisting of silicon nitride, silicon oxide, silicon oxy-nitride, intrinsic amorphous silicon, $MgF_2$, ZnS, $TiO_2$ and $CeO_2$, or a multi-layer film structure comprising a combination of two or more films. Thus, the second anti-reflection film 160 reduces reflection rate of solar rays incident on the rear surface of the substrate 110, and if the substrate 110 is an N-type, performs the function of a passivation layer. The second anti-reflection film 160 described above has a refractive index ranging from 1.8 to 2.5 and thickness of 60 to 100 μm.

Meanwhile, if the substrate 110 is a P-type, a passivation layer may be further included between the back surface field layer 150 and the second anti-reflection film 160. The passivation layer may be formed from SiOx, AlxOy, and so on. Accordingly, a structure of passivation layer/second anti-reflection film 160 such as $SiO_2$/SiNx, $Al_2O_3$/SiNx and so on is possible but is not limited to the above.

A multiple number of rear finger lines 170 may be formed and if the substrate 110 is an N-type, for ohmic contact with the back surface field layer 150, the rear finger lines 170 may be formed in such a way that paste comprising Ag, glass frit, and so on is screen printed on the substrate 110. If the substrate 110 is a P-type, the rear finger lines 170 may be formed by using paste comprising AgAl, glass frit, and so on.

Also, the rear finger lines 170 may be formed by removing of the second anti-reflection film 160 by using laser ablation, depositing a seed layer based on Ni at the removed portions, and then depositing a metal layer by using coating or sputtering. The rear finger lines 170 formed as described above may have a structure of Ni/Cu/Sn, Ni/Ag, or Ni/Cu/Ag but are not limited to the above. Additionally, the rear finger lines 170 above may be formed to have a width of 10 μm or more and a height of 60 to 80 μm, but are not limited to the above.

A plurality of rear finger lines 170 may be adjoined to a rear surface bus electrode 190 intersecting the rear finger lines 170 and provide currents generated due to the photovoltaic effect to the outside.

Meanwhile, the number of rear finger lines 170 may be different from the number of front finger lines 140. For example, the number or the quantity of the rear finger lines 170 may be larger than that of front finger lines 140.

If the number of the rear finger lines 170 is bigger than that of front finger lines 140, traveling distances of electrons or holes toward the rear finger lines 170 becomes shorter, reducing the overall resistance of the solar cell 100. In addition, since there is no need to increase the number of the front finger lines 140 to decrease the resistance, optical absorption in the front surface of the solar cell 100 is not additionally impeded and thus, reduction of optical absorption rate of the solar cell 100 may be prevented or reduced.

FIG. 3 is a cross-sectional view of the solar cell of FIG. 1 along line B-B'. FIG. 3 illustrates a situation where the back surface field layer 150 is formed separated from the edge of the rear surface of the substrate 110 by a distance or a gap 'T'. In other embodiments, the emitter layer 120 may be formed separated from the edge of the substrate 110 and both of the emitter layer 120 and the back surface field layer 150 may be formed separated from the edge of the substrate 110 by the gap 'T'. In what follows, description will be given with reference to FIG. 3.

As shown in FIG. 3, if the back surface electric field layer 150 is formed separated from the edge of the substrate 110, the back surface field layer 150 and the emitter layer 120 may be kept from being shorted. In this instance as described below, an additional process of edge isolation for preventing the front and the rear surfaces of the substrate 110 from being shorted may be omitted. Also, when the substrate 110 is doped with impurities for forming the back surface field layer 150, diffusion of the impurities up to the side surface of the solar cell 100 is prevented or reduced, to thereby suppress the occurrence of hot spots that are generated as excessive currents flow through the side surface of the solar cell 100.

It should be noted, however that a second impurity for forming the back surface field layer 150 may come to be included within the gap T between the back surface field layer 150 and the edge of the rear surface of the substrate 110 due to diffusion. However, the amount of the second impurity in the gap T is so small that the back surface field layer 150 and the emitter layer 120 may be kept from being shorted. Accordingly, the amount of the second impurity in the gap T may be ignored.

Meanwhile, the gap (or distance) T between the back surface field layer 150 and the edge of the rear surface of the substrate 110 may range from 2 to 300 μm. If the gap (or distance) T between the back surface field layer 150 and the edge of the rear surface of the substrate 110 is shorter than 2 μm, the back surface field layer 150 and the emitter layer 120 may be shorted due to diffusion of impurities, which may be a cause for degrading the efficiency of the solar cell 100. On other hand, if the distance T between the back surface field layer 150 and the edge of the rear surface of the substrate 110 is longer than 300 μm, a size of the back surface field layer 150 to be formed is reduced and thus, recombination of electron hole pairs is facilitated, which may degrade the efficiency of the solar cell 100.

Figure 4:
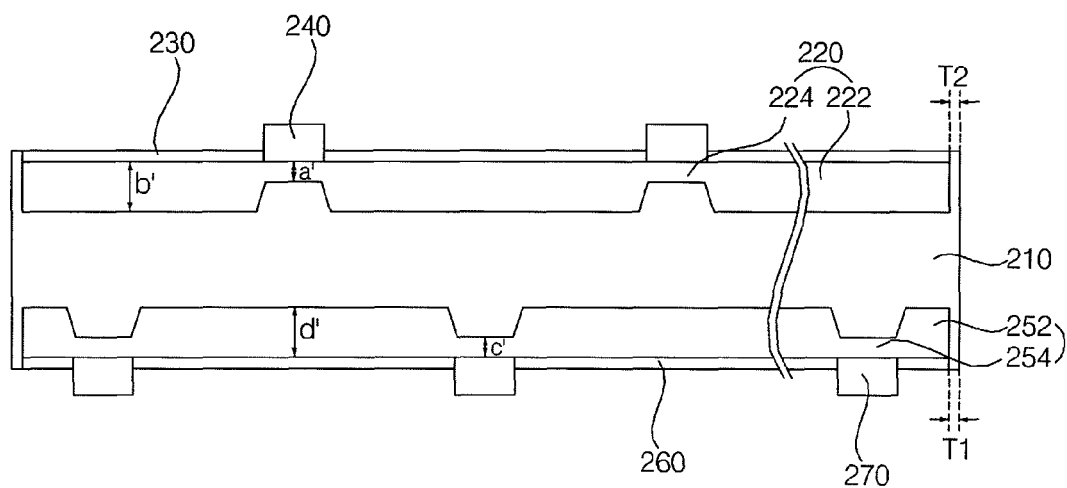
FIG. 4 is a cross-sectional view of a solar cell according to another embodiment of the invention.
Figure 5:
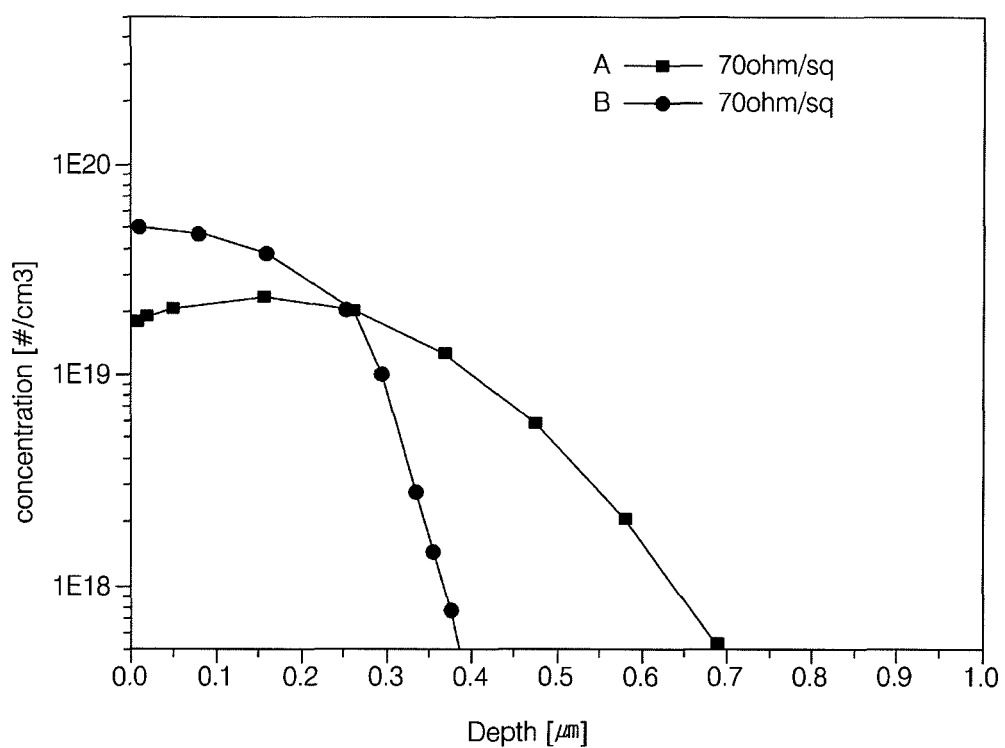
FIG. 5 is a doping profile of an emitter layer of the solar cell of FIG. 4.
Figure 6:
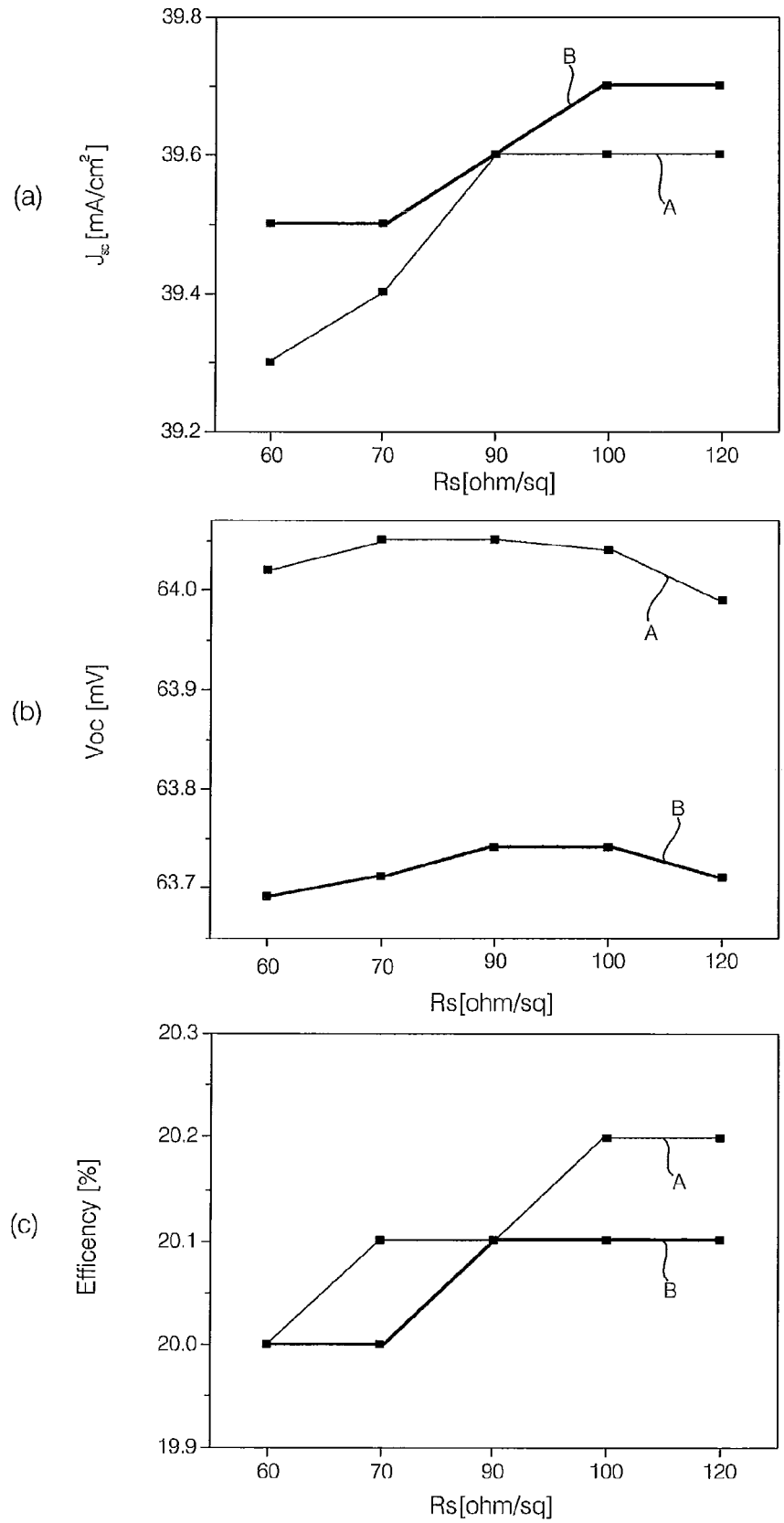
FIG. 6 illustrates results of measuring varying resistance of the emitter layer having a doping profile in a solar cell as shown in FIG. 5.

FIG. 4 is a cross-sectional view of a solar cell according to another embodiment of the invention; FIG. 5 is a doping profile of an emitter layer of the solar cell of FIG. 4; and FIG. 6 illustrates results of measuring varying resistance of the emitter layer having a doping profile in a solar cell as shown in FIG. 5.

With reference to FIG. 4, a solar cell 200 according to another embodiment of the invention includes a silicon semiconductor substrate 210 of a first conductive type, an emitter layer 220 disposed on one surface of the substrate 210, a plurality of front finger lines (front finger electrodes) 240 connected to the emitter layer 220, and a plurality of rear finger lines (rear finger electrodes) 270 connected to a back surface field layer 250 on the other side of the substrate 210. The solar cell 200 may further comprise a first anti-reflection film 230 on the emitter layer 220 and a second anti-reflection film 260 on the back surface field layer 250.

The substrate 210, the first anti-reflection film 230, the front finger lines 240, the second anti-reflection film 260, and the rear finger lines 270 are similar to corresponding portions as described in FIGS. 1 to 3. Thus, their overlapping descriptions are not repeated.

With reference to FIG. 4, the emitter layer 220 may include a first area 224 adjoining the plurality of front finger lines 240 and a second area 222 that are between areas among the plurality of front finger lines 240, namely, the respective areas that are between a plurality of first areas 224. In this instance, doping density of the first area 224 may be made larger than that of the second area 122 while doping depth b' of the second area may be made deeper than the doping depth a' of the first area 224.

FIG. 5 illustrates a doping profile of the emitter layer 220 of FIG. 4. A of FIG. 5 denotes the case (or profile) where the entire emitter layer 220 has a doping depth b' of the second area 222 while B denotes the case (or profile) where the entire emitter layer 220 has a doping depth a' of the first area 224. In this instance, areas formed by the respective graphs A and B of FIG. 5 have the same size. In other words, though doping depth of A of FIG. 5 is deeper than that of B, A and B have the same resistance value, both being set to 70Ω/□.

FIG. 6 illustrates results of measuring varying resistance of the emitter layer 220 having a doping profile as shown in FIG. 4. With reference to FIG. 6, as shown in (a) of FIG. 6, Jsc is somewhat reduced in the case A where a doping depth for the emitter layer 220 is deeper than that of the case B. However, as shown in (b) of FIG. 6, since surface recombination velocity (SRV) for A is improved as surface doping density is lowered, Voc is increased significantly compared with the case B. As a result, as shown in (c), the overall efficiency of a solar cell is increased for A where doping depth is deeper than that of B.

Meanwhile, the first area 224 is a high density doping area for reducing contact resistance against the front finger lines 240. Thus, since there are high chances that recombination sites for minor carriers are increased, it is preferable but not required that doping depth a' of the first area 224 is made shallower than the doping depth b' of the second area 222. By doing so, reduction of Jsc due to recombination of carriers may be prevented or reduced.

Therefore, a solar cell 200 according to one embodiment of the invention may compensate the amount of reduction of the Jsc due to recombination of carriers as well as the amount of increase of the Voc by forming thickness b' of the second area 222 to be larger than the thickness a' of the first area 224 adjoining the front finger lines 240, and may improve the fill factor of the solar cell 200 by lowering a contact resistance against the front finger lines 240.

The first area 224 of the emitter layer 220 may have a doping density ranging from 1E19 to 1E21 and surface resistance of 30 to 70Ω/□, for instance 40 to 60Ω/□. On the other hand, the second area 222 of the emitter layer 220 may have a doping density ranging from 5E18 to 1E20 and surface resistance of 70 to 150Ω/□, for instance 90 to 120 Ω/□.

Meanwhile, the back surface field layer 250 may have the same structure as the emitter layer 220. In other words, the back surface field layer 250 may comprise a third area 254 adjoining the plurality of rear finger lines 270 and a fourth area 252 corresponding to the areas among the plurality of rear finger lines 270, namely, the respective areas that are between a plurality of third areas 254. In this instance, doping depth d' of the fourth area 252 may be made deeper than the doping depth c' of the third area 254.

The structure above provides the same result as the emitter layer 220 described above. In other words, the Jsc is reduced by some amount. However, the Jsc may be compensated as the doping thickness c' of the third area 254 is reduced. Besides, since the Voc is improved as the doping thickness d' of the fourth area 252 is made thicker, the overall efficiency of the solar cell may be further improved.

On the other hand, a doping density of impurities in the third area 254 may be made larger than a doping density of impurities in the fourth area 252, reducing contact resistance against the rear finger lines 270. In this instance, the third area 254 may be set to have a doping density of 1E19 to 1E21 and surface resistance of 30 to 70Ω/☐, for instance 40 to 60Ω/☐ while the fourth area 252a doping density of 5E18 to 1E20 and surface resistance of 70 to 150Ω/☐, for instance 90 to 120 Ω/☐.

In this instance, a thickness of the back surface field layer 250 and a thickness of the emitter layer 220 may be different from each other. In other words, if the substrate 210 is an N-conductive type, the thickness of the back surface field layer 250 doped with an N-type impurity (e.g., P) may be made thicker than the thickness of the emitter layer 220 doped with a P-type impurity (e.g., B). Due to this, the overall series resistance of the solar cell 200 is reduced, increasing the FF of the solar cell 200. More specifically, a doping thickness c' of the third area 254 of the back surface field layer 250 is thicker than the doping thickness a' of the first area 224 of the emitter layer 220, and a doping thickness d' of the fourth area 252 of the back surface field layer 250 may be made thicker than the doping thickness b' of the second area 222 of the emitter layer 220. Also, a width of the fourth area 252 of the back surface field layer 250 may be made larger than a width of the second area 222 of the emitter layer 220.

Also, if the substrate 210 is a P-conductive type, a thickness of the emitter layer 220 doped with an N-type impurity (e.g., P) may be made thicker than the thickness of the back surface field layer 250 doped with a P-type impurity (e.g., B). Due to this, a density of surface impurities of the emitter layer 220 may be reduced and forming a deep junction is made simple. Thus, open circuit voltage Voc of the solar cell 200 may be increased. More specifically, the doping thickness c' of the third area 254 of the back surface field layer 250 is thinner than the doping thickness a' of the first area 224 of the emitter layer 220, and the doping thickness d' of the fourth area 252 of the back surface field layer 250 is thinner than the doping thickness b' of the second area 222 of the emitter layer 220. Also, a width of the fourth area 252 of the back surface field layer 250 may be made smaller than the width of the second area 222 of the emitter layer 220.

FIG. 4 further illustrates a situation where the back surface field layer 250 is separated from the edge of the substrate 210 by a gap (or a distance) T1 while the emitter layer 220 is separated from the edge of the substrate 210 by a gap (or a distance) T2. Due to the above configuration, the back surface field layer 250 and the emitter layer 220 may be prevented from being shorted and hot spots generated as excessive currents flow through the side surface of the solar cell 200 may be suppressed. Also, an additional edge isolation process used for preventing the front and the rear surface of the substrate 210 from being shorted may be omitted.

In this instance, the distance T1 between the back surface field layer 250 and the edge of the rear surface of the substrate 210, and the distance T2 between the emitter layer 220 and the edge of the front surface of the substrate 210 may be 2 to 300 μm. If the above gaps T1, T2 are shorter than 2 μm, the back surface field layer 250 and the emitter layer 220 may be shorted due to diffusion of impurities, which may be a cause for degrading the efficiency of the solar cell 200. On the other hand, if the above gaps T1, T2 are larger than 300 μm, size of the back surface field layer 250 and the emitter layer 220 to be formed are reduced and thus, recombination of electron-hole pairs is facilitated, which may degrade the efficiency of the solar cell 200.

However, embodiments of the invention are not limited to the above situation. Rather, it is sufficient that either of the back surface field layer 250 and the emitter layer 220 is separated from the edge of the substrate 210.

Figure 7:
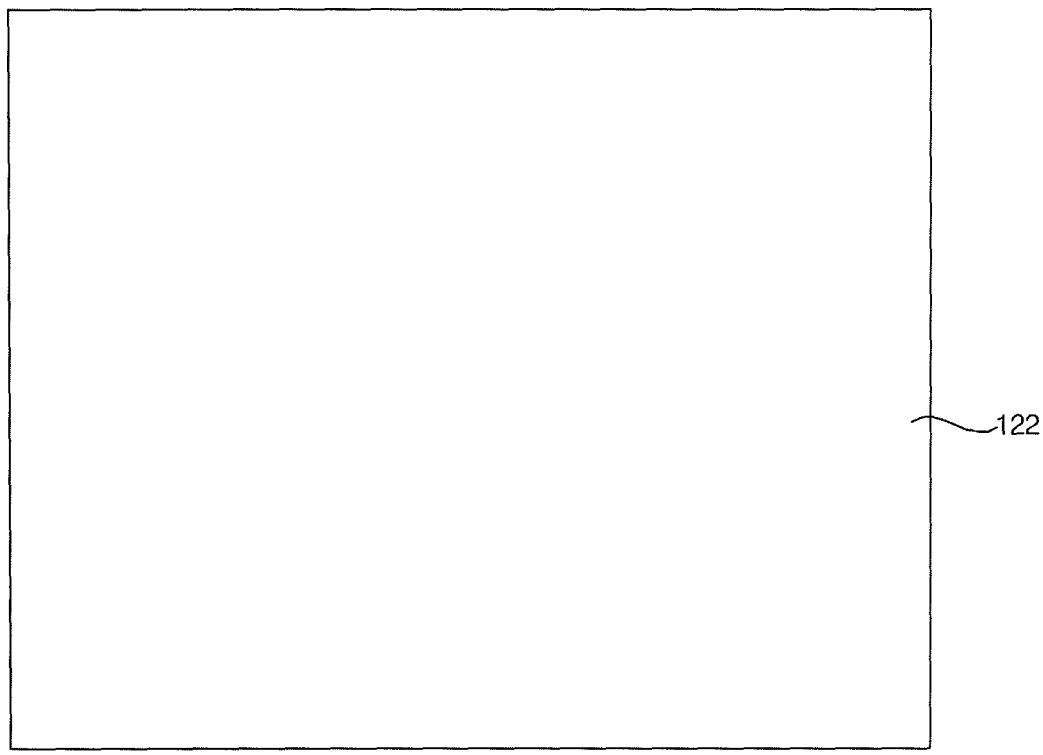
FIGS. 7 to 12 are views illustrating method of manufacturing a solar cell according to one embodiment of the invention.
Figure 7:
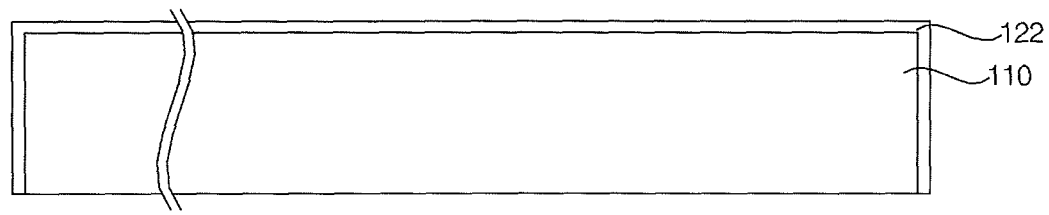

FIGS. 7 to 12 illustrate a manufacturing method for a solar cell according to one embodiment of the invention. First, FIGS. 7 to 11 illustrate one example of a process for manufacturing a solar cell 100 shown in FIGS. 1 to 3. Accordingly, a manufacturing method for a solar cell 100 according to one embodiment of the invention will be described with reference to FIGS. 7 to 11. First of all, as shown in FIG. 7, silicon semiconductor substrate 110 of a first conductive type is first doped with a first impurity of a second conductive type that is opposite the first conductive type so as to have a first doping density, to thereby form a second area 122 of the emitter layer 120 described above. Forming the second area 122 may be carried out by doping the substrate 110 with the first impurity of the second conductive type according to a heat diffusion method, a laser doping method, or an ion implantation method. Other methods for doping the substrate 110 may be used.

This embodiment of the invention describes a case where the emitter layer 122 is formed on the entire front surface of the substrate 110, but embodiments of the invention are not limited to the above case. Therefore, if the emitter layer 220 is to be formed separated from the edge of the substrate 110 as is the case of the solar cell 200 of FIG. 4, the substrate 110 may be first doped with a mask wrapping (or covering) the periphery of the substrate 110. The shape of such a mask is similar to the one shown in (a) of FIG. 9.

Meanwhile, a convex-concave structure may be formed first on the substrate 110. The convex-concave structure may be formed by applying a process of dipping the substrate 110 in an etching solution. The convex-concave structure may be formed in the shape of a pyramid, a square, or a triangle. Other shapes may be used to form the convex-concave structure.

Figure 8:
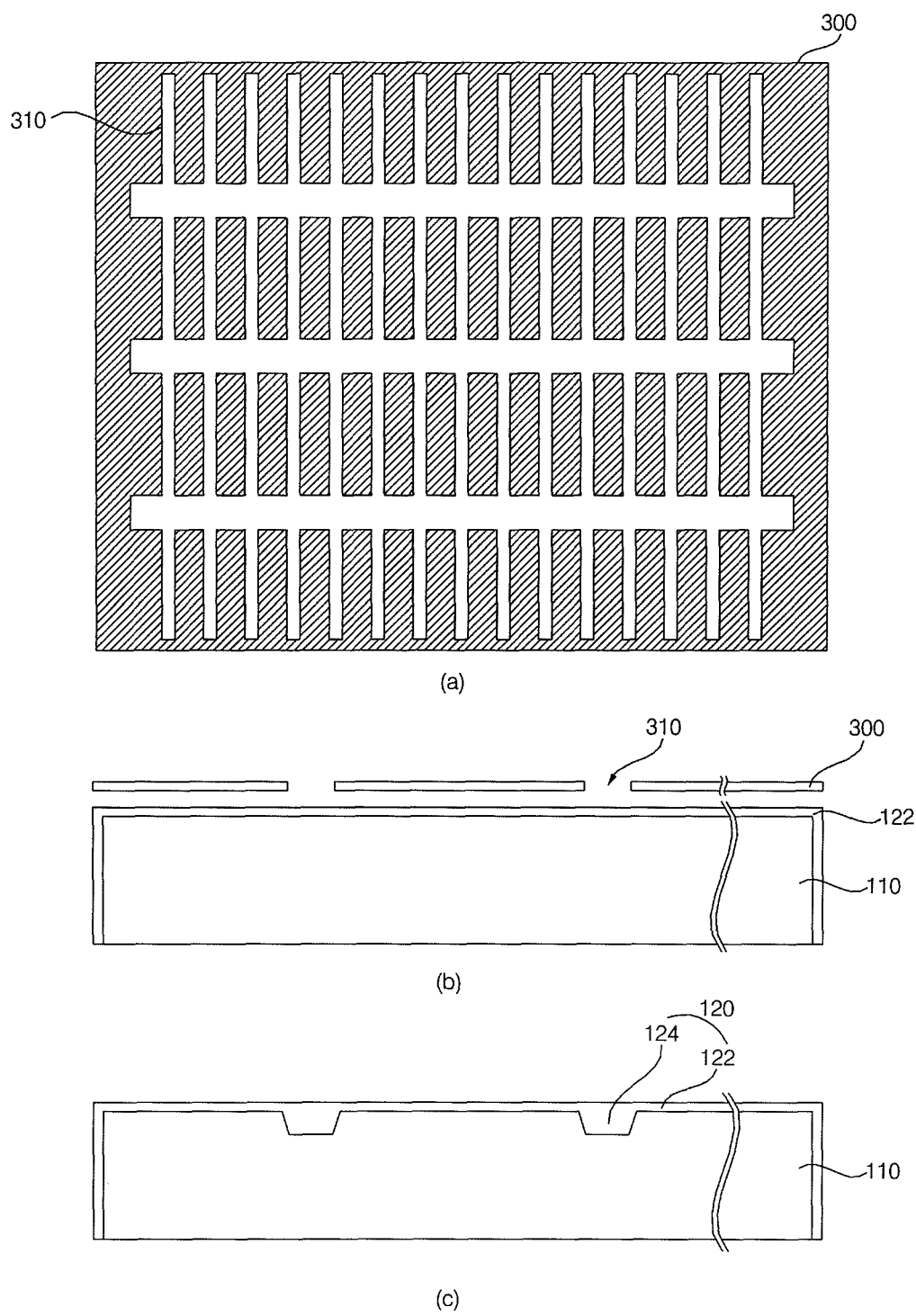

Next, prepared is a first mask 300 including openings 310 corresponding to positions at which a plurality of front finger lines 140 are to be formed as shown in (a) of FIG. 8. As shown in (b) of FIG. 8, the mask 300 is positioned on the substrate 110 which is second doped with the first impurity of the second conductive type by using the ion implantation method and so on, thereby forming the first area 124 of the emitter layer 120 as shown in (c) FIG. 8. The openings 310 may be formed not only at the positions where the front finger lines 140 are to be formed, but also at the positions where the front surface bus electrodes (180 of FIG. 1) are to be formed. Accordingly, as shown in (a) of FIG. 8, the openings 310 may be formed to have a grid shape to correspond to the front finger lines 140 and the front surface bus electrodes 180.

The second doping may be carried out by employing the ion implantation method, for example. The first area 124 formed by the second doping has a second doping density higher than that of the second area 122. The second doping density may range from 1E19 to 1E21. Accordingly, as described later, contact resistance against the front finger lines 140 may be reduced. Therefore, a selective emitter structure may be provided.

Figure 9:
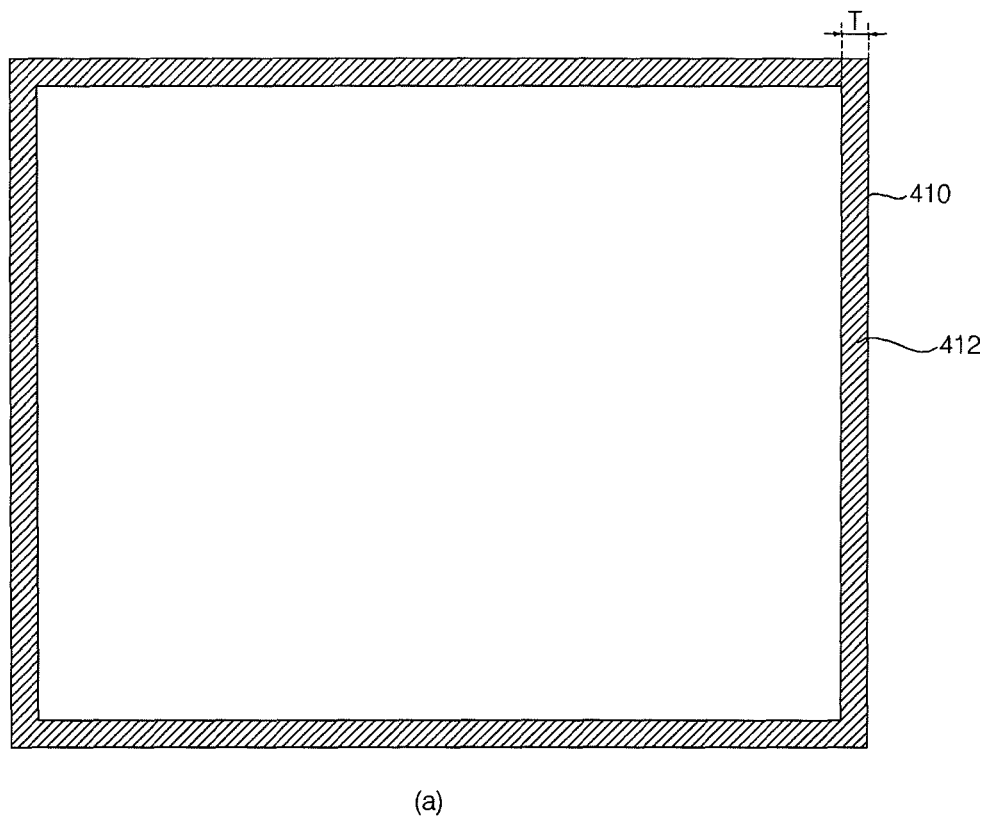
Figure 9:
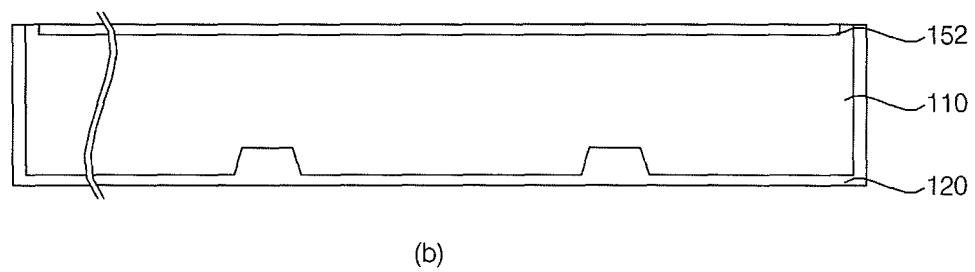

Next, as shown in FIG. 9, by using a second mask 410 having a part 412 to cover or overlap the edge part of the rear surface of the substrate 110, the fourth area 152 of the back surface field layer 150 is formed.

The fourth area 152 prevents or reduces recombination of electron-hole pairs separated from the rear surface of the substrate 110. The fourth area 152 may be formed by doping the substrate 110 with a second impurity of the same conductive type as the substrate 110 according to a heat diffusion method, a laser doping method, or an ion implantation method, as well as other methods. The fourth area 152 may have a doping density ranging from 5E18 to 1E20 and a doping depth of 0.3 μm to 1 μm.

Also, since the second mask 410 used for forming the fourth area 152 has the part 412 that covers or overlaps a distance T measured from the edge part of the rear surface of the substrate 110, the second mask 410 may be used to prevent contact of the second area 152 with the emitter layer 120 which is formed on the side surface of the substrate 110. Therefore, an additional edge isolation process for insulating the front and the rear surfaces of the substrate 110 may be omitted.

Owing to the above structure, the back surface field layer 150 is formed separated from the edge of the rear surface of the substrate 110 by a distance 'T'. In this instance, the distance T between the back surface field layer 150 and the edge of the rear surface of the substrate 110 may range 2 to 300 μm.

Meanwhile, the second mask 410 may also be used for forming the second area 122 of the emitter layer 120 so that the emitter layer 120 is separated from the edge of the substrate 110. Accordingly, the second mask 410 may be used for forming both of the emitter layer 120 and the back surface field layer 150, thereby making both of the emitter layer 120 and the back surface field layer 150 be separated from the edge of the substrate 110. If the second mask 410 is used to form the second area 122, the second mask 410 may be used instead of the first mask 300 and replace the process shown in FIG. 7.

Figure 10:
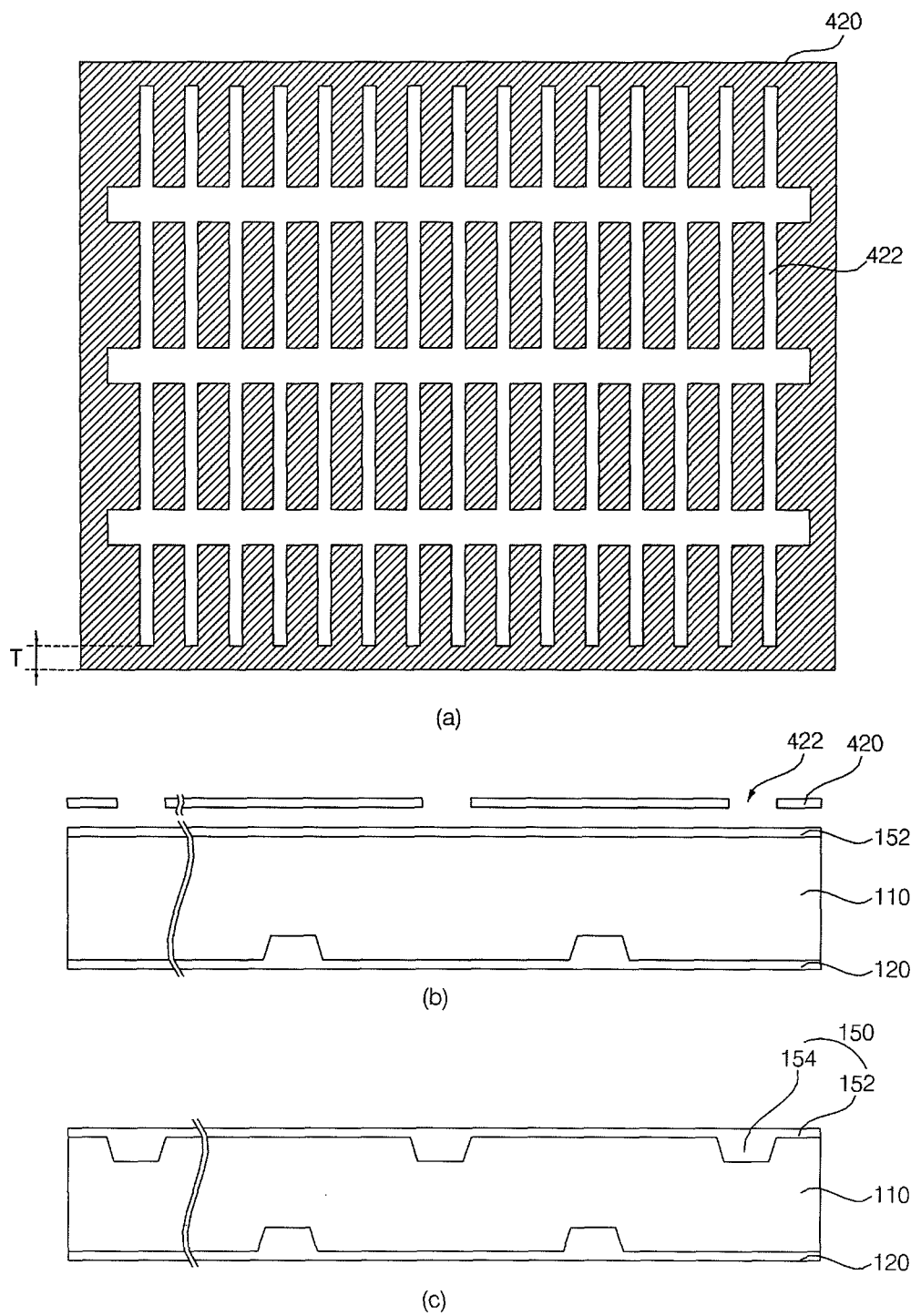

Next, as shown in (a) of FIG. 10, prepared is a third mask 420 containing openings 422 corresponding to positions at which a plurality of rear finger lines 170 are to be formed. As shown in (b) of FIG. 10, the mask 420 is positioned on the rear surface of the substrate 110 and second doped with a second impurity by using, e.g., an ion implantation method, forming the third area 154 of the back surface field layer 150 as shown in (c) of FIG. 10.

The openings 422 of the third mask 420 may be formed not only at positions corresponding to where the rear finger lines 170 are to be formed, but also at positions corresponding to where the rear surface bus electrodes (190 of FIG. 1) are to be formed on the substrate 110. Accordingly, as shown in (a) of FIG. 10, the openings 422 may be formed to have a grid shape to correspond to the back surface finger lines 170 and the back surface bus electrodes 190.

Since the third mask 420 also covers a distance of T measured from the edge part of the rear surface of the substrate 110, the third mask 420 maintains the gap T formed by using the second mask 410 to prevent contact of the emitter layer 120 having the fourth area 152 the side surface of the substrate 110. Therefore, an additional edge isolation process for insulating the front and the rear surface of the substrate 110 may be omitted.

Owing to the above structure, the back surface field layer 150 is formed by being separated by a gap 'T' from the edge of the rear surface of the substrate 110. In this instance, the distance T between the back surface field layer 150 and the edge of the rear surface of the substrate 110 may range 2 to 300 μm.

In this instance, the number of openings 422 formed in the third mask 420 may be larger than the number of openings 310 formed in the first mask 300.

Subsequently, heat treatment is applied simultaneously to the emitter layer 120 doped with the first impurity and the back surface field layer 150 doped with the second impurity.

On the other hand, the first and the second impurity may be doped by using an ion implantation, for example. In this instance, the ion implantation for doping of the first and the second impurity may be carried out without changing processing conditions and accordingly, productivity in manufacturing of solar cells 100 may be increased. In other words, after the first impurity is doped by using the ion implantation, the second impurity may be doped by using the ion implantation under the same conditions; accordingly, the first and the second impurity may be doped, each with a similar projected depth range Rp into the substrate 110.

On the other hand, in one example embodiment of the invention, if the substrate 210 is an N-conductive type, a first impurity may be a P-type impurity (e.g., B) while a second impurity may be an N-type impurity (e.g., P). If the emitter layer 120 doped with the first impurity and the back surface field layer 150 doped with the second impurity are calcinated or heat treated at the same time, since diffusion is better facilitated for an N-type impurity than for a P-type impurity, a thickness of the back surface field layer 150 doped with the second impurity becomes thicker than a thickness of the emitter layer 120. Additionally, the overall series resistance of the solar cell 200 is reduced and thus, FF of the solar cell 100 may be increased.

In another example embodiment of the invention, if the substrate 210 is an N-conductive type, the first impurity may be an N-type impurity (e.g., P) while the second impurity may be a P-type impurity (e.g., B). Therefore, the thickness of the emitter 120 becomes thicker than the thickness of the back surface field layer 150, and a deep junction is formed easily. Therefore, an open circuit voltage Voc of the solar cell 200 may be increased.

Figure 11:
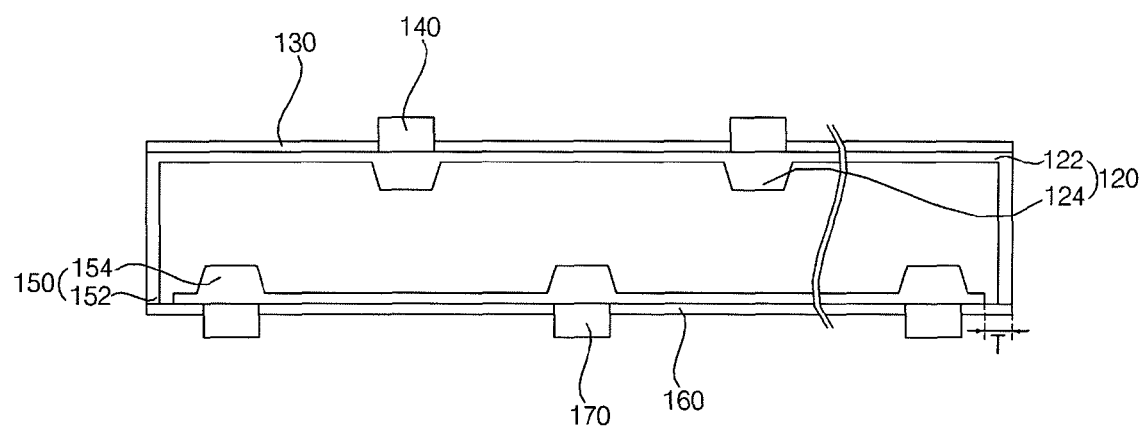

Next, as shown in FIG. 11, a first anti-reflection film 130 and front finger lines 140 are formed on the emitter layer 120, and a second anti-reflection film 160 and rear finger lines 170 are formed on the back surface field layer 150. Also, a passivation layer may be further formed on the emitter layer 120 and the back surface field layer 150. That is, an oxide film may be formed at a time when heat treatment for the emitter layer 120 and the back surface field layer 150 is performed, whereby the oxide film may be used as the passivation layer.

The first anti-reflection film 130 and the second anti-reflection film 160 may be formed by employing a vacuum deposition method, a chemical vapor deposition method, spin coating, screen printing, or spray coating, but is not limited thereto.

The front finger lines 140, for example, may be formed in such a way that paste for front surface electrodes is screen printed on the area on the substrate 110 where the front finger lines 140 are to be formed by using a mask, and heat treatment is applied for the paste. In the printed paste, as silver contained in the paste is transformed to a liquid by heating at high temperatures and is crystallized again into a solid after the heating, the silver makes contact with the first area 124 of the emitter layer 120 due to a fire-through phenomenon in which the printed paste penetrates the first anti-reflection film 130 through use of a glass frit.

Also, the front finger lines 140 may be formed by removing of the first anti-reflection film 130 and/or the passivation layer by using laser ablation, depositing a seed layer based on Ni at the removed portions, and then depositing a metal layer by using coating or sputtering. In addition, the front finger lines 140 may be formed by a laser firing method and a method of using screen printing after laser ablation, but is not limited thereto.

Since the rear finger lines 170 may be formed in a similar way as the front finger lines 140, a detailed description of forming the rear finger lines 170 will not be given.

Meanwhile, the number of rear finger lines 170 to be formed may differ from the number of front finger lines 140 to reduce or prevent the reduction of resistance of the solar cell 100 and the degradation of photovoltaic conversion efficiency of the solar cell 100. For example, the number of rear finger lines 170 may be larger than that of the front finger lines 140.

Figure 12:
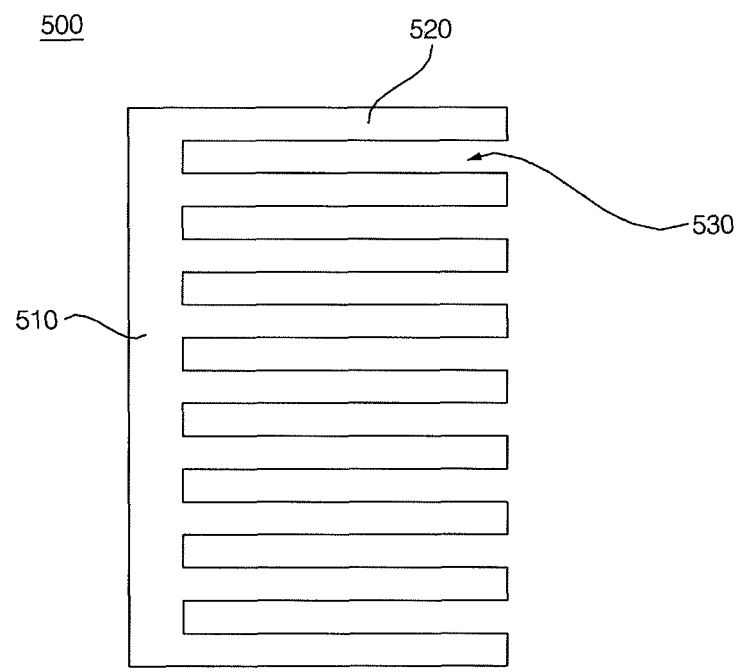

FIG. 12 illustrates a comb mask. By using the comb mask 500, the first area 124 and the second area 122 of the emitter layer 120 or the third area 154 and the fourth area 152 of the back surface field layer 150 may be doped with impurities at the same time.

The comb mask 500 includes a supporting unit 510 and a plurality of teeth 520 that extend from the supporting unit 510. Among a plurality of teeth 520, openings in the form of slots 530 are formed. To give a simplified example of a method for forming the emitter layer 120 by using such a comb mask 500, the comb mask 500 is fixed at a position on the substrate 110, and the first impurity is injected on the substrate 110 through the slots 530, and thereby forming the first area 124 of the emitter layer 120. After the first area 124 is formed, the substrate 110 positioned in a lower part of the comb mask 500 moves and the first impurity is injected into the substrate 110 continuously, thereby forming the second area 122. In this instance, doping densities of the first 124 and the second area 122 may be controlled by adjusting an ion injection time, an amount of ions used for doping an, ion acceleration energy, and so on.

Therefore, the emitter layer 120 and the back surface field layer 150, or the emitter layer 220 and the back surface field layer 250 of FIG. 4 may be formed at the same time (or together) by using the comb mask.

Figure 13:
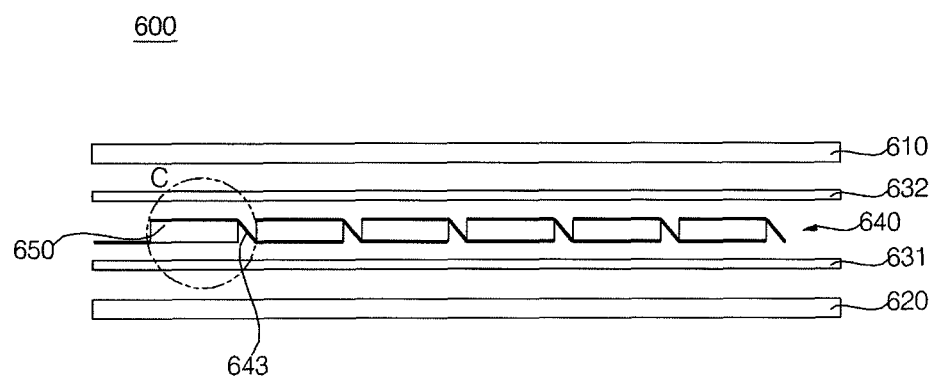
FIG. 13 is a cross-sectional view of a solar cell module according to one embodiment of the invention.
Figure 14:
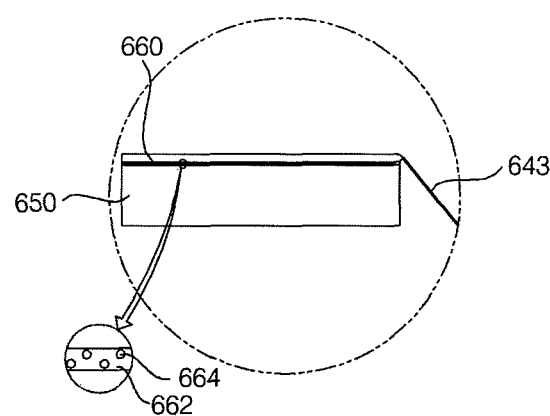
FIG. 14 is a magnified view of C of FIG. 13.

FIG. 13 is a cross-sectional view of a solar cell module according to one embodiment of the invention and FIG. 14 is a magnified view of C of FIG. 13. With reference to FIG. 13, a solar cell module 600 according to one embodiment of the invention may include a plurality of solar cells 650, a plurality of ribbons 643 connecting a plurality of solar cells 650 electrically, a first sealing film 631 and a second sealing film 632 sealing a plurality of solar cells 650 at both sides, a front substrate 610 protecting one surface of the solar cells 650; and a rear substrate 620 protecting the other surface of the solar cells 650.

The plurality of solar cells 650 are connected to each other electrically through the ribbon 643, thereby forming a string 640. For example, two lines of the ribbon 643 are attached on the upper and lower part of the solar cells 650 through a tabbing process, and connecting the plurality of solar cells 650 electrically. In other words, the tabbing process includes spraying flux on one surface of the solar cells 650, positioning the ribbon 643 at the solar cells 650 on which the flux has been sprayed, and applying a calcination process (or applying heat).

On the other hand, as shown in FIG. 14, a conductive film 660 may be attached between one surface of the solar cells 650 and the ribbon 643; and then the plurality of solar cells 650 may be connected in series or in parallel by using thermo-compression to fix the ribbon 643 to the plurality of solar cells 650.

The conductive film 660 may comprise a base film 662 and conductive particles 664 distributed across the base film 662. Conductive particles 664 are exposed to the outside of the base film 662 due to thermo-compression, and the solar cells 650 and the ribbon 643 may be connected to each other electrically due to the exposed conductive particles 664.

The base film 662 may be formed using a thermosetting resin with excellent adhesion and insulation property such as epoxy resin, acrylic resin, polyimide resin, and polycarbonate resin, for example. Conductive particles 664 may be gold, silver, nickel, or copper particles, for example, showing excellent conductive property. Also, the conductive particles 664 may be particles formed by coating a metal layer onto a polymer particle using the above noted metals.

Therefore, when the plurality of solar cells 650 are formed into a module by being connected to each other using a conductive film, a process temperature thereof may be lowered, thus preventing the string 640 from becoming bent.

Again, with reference to FIG. 13, the first sealing film 631 and the second sealing film 632 seal the plurality of solar cells 650 at both surfaces. The first sealing film 631 and the second sealing film 632 are fastened to each other by lamination, isolating the plurality of solar cells 650 from moisture or oxygen which can adversely affect the plurality of solar cells 650.

Also, the first sealing film 631 and the second sealing film 632 help each element of the solar cells 650 to combine chemically with each other. For the first sealing film 631 and the second sealing film 632, ethylene vinyl acetate (EVA) copolymer resin, polyvinyl butyral, ethylene vinyl acetate partial oxide, silicon resin, ester resin, olefin resin, etc., may be employed.

It is preferable but not required that the front substrate 610 is positioned on the first sealing film 631 for solar rays to pass through, and the substrate 610 is made of reinforced glass to protect the solar cells 650 from external shocks. Also, it is more preferable but not required that a low iron reinforced glass is used for reducing or preventing reflection of solar rays and increasing permeability of solar rays.

The rear substrate 620 is intended to protect solar cells 650 at the rear surface of the solar cells 650, providing a water proofing function, an insulation function, and an ultraviolet blocking function. The rear substrate 620 may be TPT (Tedlar/PET/Tedlar) type but is not limited thereto. Also, the rear substrate 620 may be formed by transparent materials through which solar rays may pass.

The solar cell according to the invention is not limited to combination of the embodiments described above or carrying out the methods described above. On the contrary, the whole or part of the respective embodiments may be combined selectively so that various modifications of the embodiments should be made possible.

According to the invention, by including an emitter layer and a back surface field layer with different thicknesses from each other, a photovoltaic conversion efficiency of a solar cell may be improved.

Also, by injecting impurities of the emitter layer and the back surface field layer through ion implantation and applying calcination at the same time, productivity of a solar cell may be increased.

In the above embodiment of FIGS. 1 to 3, the emitter layer includes the first area 124 and the second area 122 having different doping concentrations, and the back surface field layer 150 includes the third area 154 and the fourth area 152 having different doping concentrations. However, the invention is not limited thereto.

Figure 15:
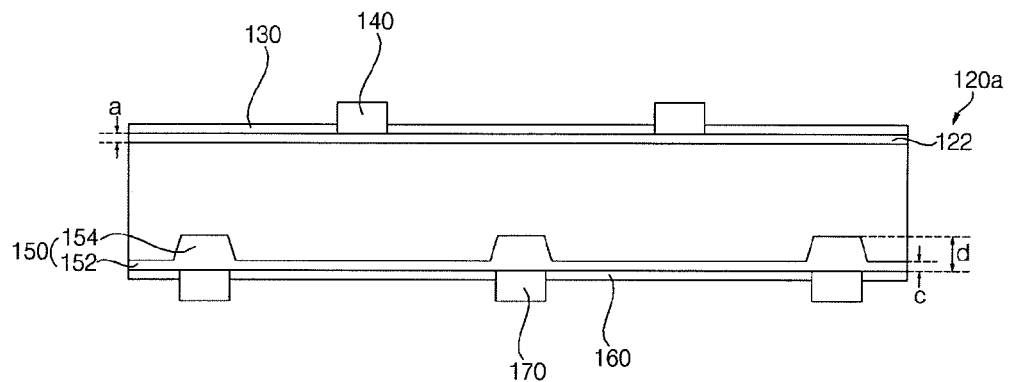
FIG. 15 is a cross-sectional view of a solar cell according to another embodiment of the invention.

Thus, with reference to FIG. 15, an emitter layer 120a may include only a second area 122 that is a shallow or lightly doping area. Also, with reference to FIG. 16, a back surface field layer 150a may include only a fourth area 152 that is a shallow doping area. In addition, with reference to FIG. 17, the emitter 120a may include only a second area 122 that is the shallow doping area, and the back surface field layer 150a may include only a fourth area 152 that is the shallow doping area, simultaneously. In embodiments of the invention, a shallow doping area covers at least a majority of, if not the entirety of, the front or the back surface of the substrate 110. In other words, the shallow doping area covers at least 51% to 100% of the front or the back surface of the substrate 110. Additionally, in the shallow doping area, a doping density or concentration of an impurity is basically homogenous, whereby there no more than 10% variation from a desired value, such as a mean value of a doping density or concentration. In embodiments of the invention, the variation may be between 0% to not more than 10%, for example.

In other embodiments of the invention, the substrate 110 may additionally include remaining areas of the front or the back surface of the substrate 110 that are not covered by the shallow doping area, which are high doping areas having a greater doping concentration than the respective shallow doping areas. For example, for the emitter layer 120 or 120a, the remaining area may be the first In these instances, the thicknesses of the shallow doping areas of the emitter layer 120 or 120a and the back surface field layer 150 or 150a are different from each other. In embodiments of the invention, the difference of the thicknesses may be 5% to 50%. In embodiments of the invention, the thicknesses of the shallow doping areas of the emitter layer 120 or 120a may be greater than the thicknesses of the back surface field layer 150 or 150a, or vice-versa. Thus, the thickness a of the second area 122 is different from the thickness c of the fourth area 152.

Figure 16:
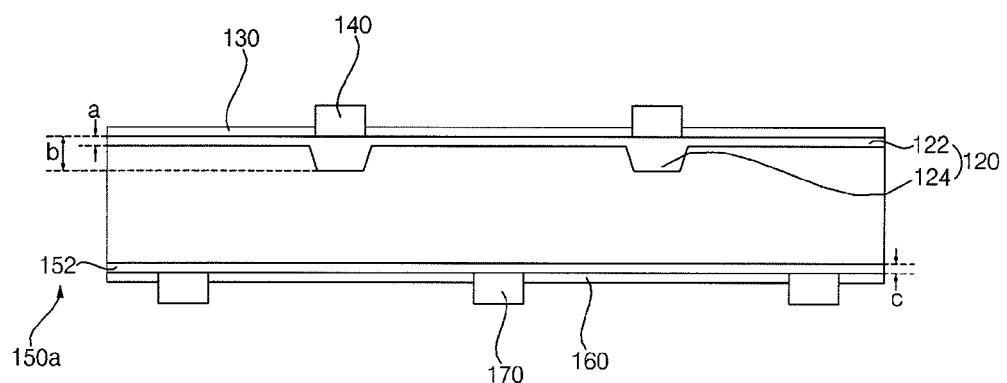
FIG. 16 is a cross-sectional view of a solar cell according to another embodiment of the invention.
Figure 17:
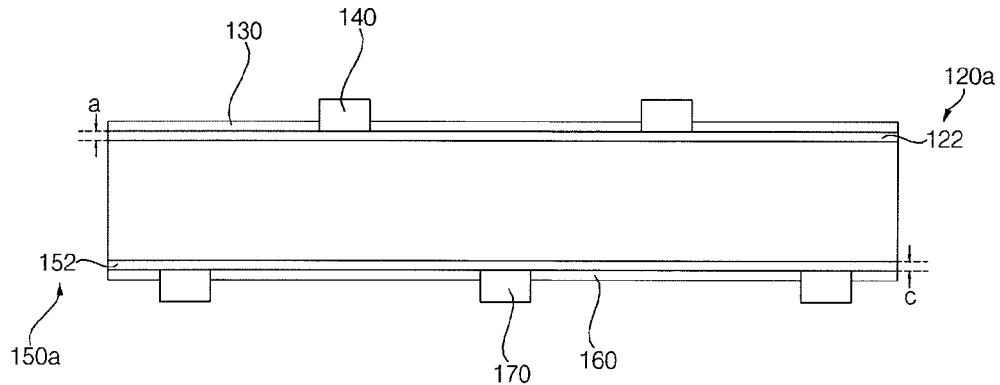
FIG. 17 is a cross-sectional view of a solar cell according to another embodiment of the invention.

Also, the modified embodiments related to the embodiment of FIGS. 1 to 3 may be applied to the embodiments of FIGS. 15 to 17.

Example embodiments of the invention have been described. However, the invention is not limited to the specific embodiments described above; various modifications of the embodiments are possible by those skilled in the art to which the invention belongs without leaving the scope of the invention defined by the appended claims. Also, modifications of the embodiments should not be understood individually from the technical principles or prospects of the invention.

What is claimed is:

1. A solar cell, comprising:
   a silicon semiconductor substrate of a first conductive type;
   an emitter layer having a second conductive type opposite the first conductive type and formed continuously on a first surface of the silicon semiconductor substrate;
   a back surface field layer having the first conductive type and formed continuously on a second surface of the silicon semiconductor substrate opposite to the first surface; and
   wherein the emitter layer includes at least a first shallow doping area and the back surface field layer includes at least a second shallow doping area,
   wherein the emitter layer further includes a first high doping area having a doping concentration different from that of the first shallow doping area, and the back surface field layer further includes a second high doping area having a doping concentration different from that of the second shallow doping area, and
   wherein a thickness of the first shallow doping area of the emitter layer is different from a thickness of the second shallow doping area of the back surface field layer.

2. The solar cell of claim 1, wherein the thickness of the first shallow doping area of the emitter layer is greater than the thickness of the second shallow doping area of the back surface field layer.

3. The solar cell of claim 1, wherein the thickness of the first shallow doping area of the emitter layer is less than the thickness of the second shallow doping area of the back surface field layer.

4. The solar cell of claim 1, wherein the thickness of the first shallow doping area of the emitter layer is 0.3 μm to 1 μm, and the thickness of the second shallow doping area of the back surface field layer is 0.3 μm to 1 μm.

5. The solar cell of claim 1, wherein the doping concentration of the first high doping area is greater than that of the first shallow doping area, and the doping concentration of the second high doping area is greater than that of the second shallow doping area.

6. The solar cell of claim 1, wherein the emitter layer further includes a first high doping area having a thickness different from that of the first shallow doping area, and the back surface field layer includes a second high doping area having a thickness different from that of the second shallow doping area.

7. The method for manufacturing a solar cell of claim 6, wherein the thickness of the first high doping area is greater than that of the first shallow doping area, and the thickness of the second high doping area is greater than that of the second shallow doping area.

* * * * *